United States Patent
Kang et al.

(10) Patent No.: US 7,903,189 B2
(45) Date of Patent: Mar. 8, 2011

(54) DISPLAY SUBSTRATE AND METHOD OF REPAIRING THE SAME

(75) Inventors: Ku-Hyun Kang, Suwon-si (KR); Dae-Keun Shin, Cheonan-si (KR); Dae-Hyuk Song, Asan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1098 days.

(21) Appl. No.: 11/619,027

(22) Filed: Jan. 2, 2007

(65) Prior Publication Data
US 2007/0285594 A1    Dec. 13, 2007

(30) Foreign Application Priority Data
Jun. 9, 2006   (KR) .................. 10-2006-0051742

(51) Int. Cl.
*G02F 1/1333*    (2006.01)
*G02F 1/1343*    (2006.01)
(52) U.S. Cl. ...................... 349/54; 349/138; 349/139
(58) Field of Classification Search ............ 349/54, 349/55
See application file for complete search history.

(56) References Cited

U.S. PATENT DOCUMENTS

| | | | |
|---|---|---|---|
| 2001/0035920 A1* | 11/2001 | Choi | 349/54 |
| 2002/0131010 A1* | 9/2002 | Ozaki et al. | 349/192 |
| 2002/0191124 A1* | 12/2002 | Nakata | 349/43 |
| 2007/0081108 A1* | 4/2007 | Tsukada | 349/54 |

FOREIGN PATENT DOCUMENTS

CN    1643443    7/2005

\* cited by examiner

*Primary Examiner* — W. Patty Chen
(74) *Attorney, Agent, or Firm* — F. Chau & Associates, LLC

(57) ABSTRACT

A display substrate includes a signal line, a protecting layer and a repairing line. The protecting layer covers the signal line to protect the signal line and has a repairing groove formed therein. The repairing line is formed in the repairing groove and is electrically connected to the signal line to repair an electrical connection failure of the signal line. The repairing groove connects a first area and a second area of the signal line that are spaced apart from each other by a predetermined distance in a lengthwise direction of the signal line. The electrical connection failure occurs between the first and second areas. The repairing line is prevented from being damaged, and a display quality is improved.

25 Claims, 15 Drawing Sheets

DISPLAY SUBSTRATE AND METHOD OF REPAIRING THE SAME

CROSS-REFERENCE TO RELATED APPLICATION

The present application claims priority to Korean Patent Application No. 2006-51742 filed on Jun. 9, 2006, the contents of which are incorporated herein by reference in their entirety.

BACKGROUND OF THE INVENTION

1. Technical Field

The present invention relates to a display substrate and a method of repairing a display substrate, and more particularly, to a display substrate of which an electrical connection failure can be repaired to improve a display quality and a method of repairing a display substrate, whereby damage to a repairing line is prevented.

2. Discussion of the Related Art

Various electronic apparatuses such as a mobile phone, a digital camera, a notebook computer, and a monitor, include a display apparatus to display an image. Examples of the display apparatus include a cathode-ray tube (CRT), a liquid crystal display (LCD), a plasma display panel (PDP), a field emission display (FED), and an electro luminescence (EL) display.

The LCD apparatus that displays an image using optical and electrical properties of liquid crystal is a flat panel display. The LCD apparatus has characteristics such as light weight, lower power consumption, and lower driving voltage, in comparison with display apparatuses such as the CRT, and the PDP.

The LCD apparatus can include an LCD panel to display an image using light transmittance of the liquid crystal and a backlight assembly disposed under the LCD panel to provide the LCD panel with light.

The LCD panel may include an array substrate, an opposite substrate and a liquid crystal layer interposed between the array substrate and the opposite substrate. The array substrate includes a signal line, a thin-film transistor (TFT) electrically connected to the signal line, a protecting layer to cover and protect the signal line and the TFT and a pixel electrode electrically connected to the TFT.

The signal line of the array substrate may have an electrical connection failure such as a short circuit, or a shorting failure. When the electrical connection failure is generated, a display quality of the LCD panel is deteriorated. Therefore, it is necessary to repair the signal line having the electrical connection failure.

A conventional method of repairing the signal line is forming a repairing line on the protecting layer. The repairing line is electrically connected to the signal line to repair the electrical connection failure.

However, the repairing line on the protecting layer is subject to damage while rinsing the array substrate.

SUMMARY OF THE INVENTION

Exemplary embodiments of the present invention provide a display substrate capable of preventing a repairing line from being damaged to improve a display quality and a method of repairing the display substrate.

In an exemplary embodiment of the present invention, a display substrate includes a signal line, a protecting layer and a repairing line. The protecting layer covers the signal line to protect the signal line and has a repairing groove formed therein. The repairing line is formed in the repairing groove and is electrically connected to the signal line to repair an electrical connection failure of the signal line. The repairing groove may connect a first area and a second area of the signal line, which are spaced apart from each other by a predetermined distance in a lengthwise direction of the signal line. The electrical connection failure occurs between the first and second areas.

For example, the protecting layer may include a first sub-protecting layer and a second sub-protecting layer that is formed on the first sub-protecting layer, and the repairing groove may be formed at the second sub-protecting layer. A first connecting hole and a second connecting hole may be formed at the first sub-protecting layer to electrically connect the repairing line to the signal line.

In an exemplary embodiment of the present invention, there is provided a method of repairing a display substrate. In the method, a portion of a protecting layer covering a signal line is removed to form a repairing groove. A repairing line is formed in the repairing groove to repair an electrical connection failure, the repairing line being electrically connected to the signal line. The repairing groove may connect a first area and a second area of the signal line that are spaced apart from each other by a predetermined distance in a lengthwise direction of the signal line. The electrical connection failure may be disposed between the first and second areas.

For example, a portion of the protecting layer corresponding to the first and second areas may be removed to form a first connecting hole and a second connecting hole through which a portion of the signal line is exposed. The repairing line may be formed in the repairing groove and electrically connected to the signal line through the first and second connecting holes.

According to exemplary embodiments of the present invention, a repairing line is formed in a repairing groove formed at a protecting layer. As a result, the repairing line may be prevented from being damaged, thereby improving a display quality.

BRIEF DESCRIPTION OF THE DRAWINGS

Exemplary embodiments of the present invention can be understood in more detail from the following descriptions taken in conjunction with the accompanying drawings, in which.

DESCRIPTION OF THE EMBODIMENTS

Exemplary embodiments of the invention are described more fully hereinafter with reference to the accompanying drawings. This invention may, however be embodied in many different forms and should not be construed as limited to the exemplary embodiments set forth herein.

Figure 1:
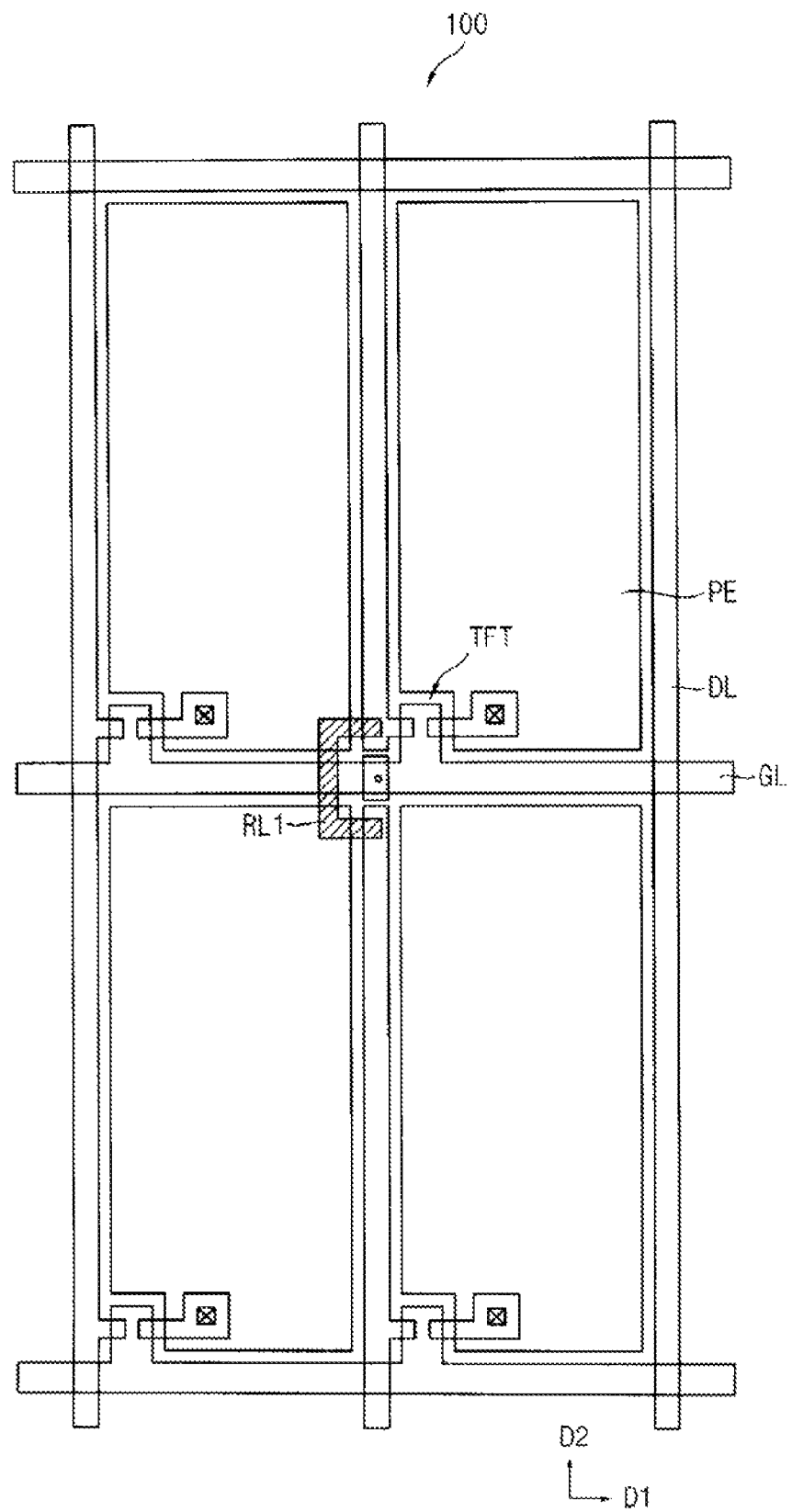
FIG. 1 is a plan view illustrating a display substrate according to an exemplary embodiment of the present invention.

FIG. 1 is a plan view illustrating a display substrate according to an exemplary embodiment of the present invention.

Referring to FIG. 1, a display substrate 100 includes a plurality of gate lines GL, a plurality of data lines DL, a thin-film transistor TFT, a pixel electrode PE and a repairing line RL1.

The gate lines GL are arranged along a column direction in FIG. 1 and extended in a first direction D1. The data lines DL are arranged in a row direction in FIG. 1, cross the gate lines GL, and are extended in a second direction D2 substantially perpendicular to the first direction D1. A plurality of pixels is defined by adjacent gate lines GL and adjacent data lines DL. The display substrate 100 is explained based on a shorting failure being generated where the gate line GL and the data line DL intersect.

The thin-film transistor TFT and the pixel electrode PE are formed in each of the pixels. The thin-film transistor TFT is electrically connected to the gate line GL and the data line DL so that a gate signal and a data signal are applied to the thin-film transistor TFT. The pixel electrode PE is electrically connected to the thin-film transistor TFT so that the pixel electrode PE is controlled by the thin-film transistor TFT.

Figure 2:
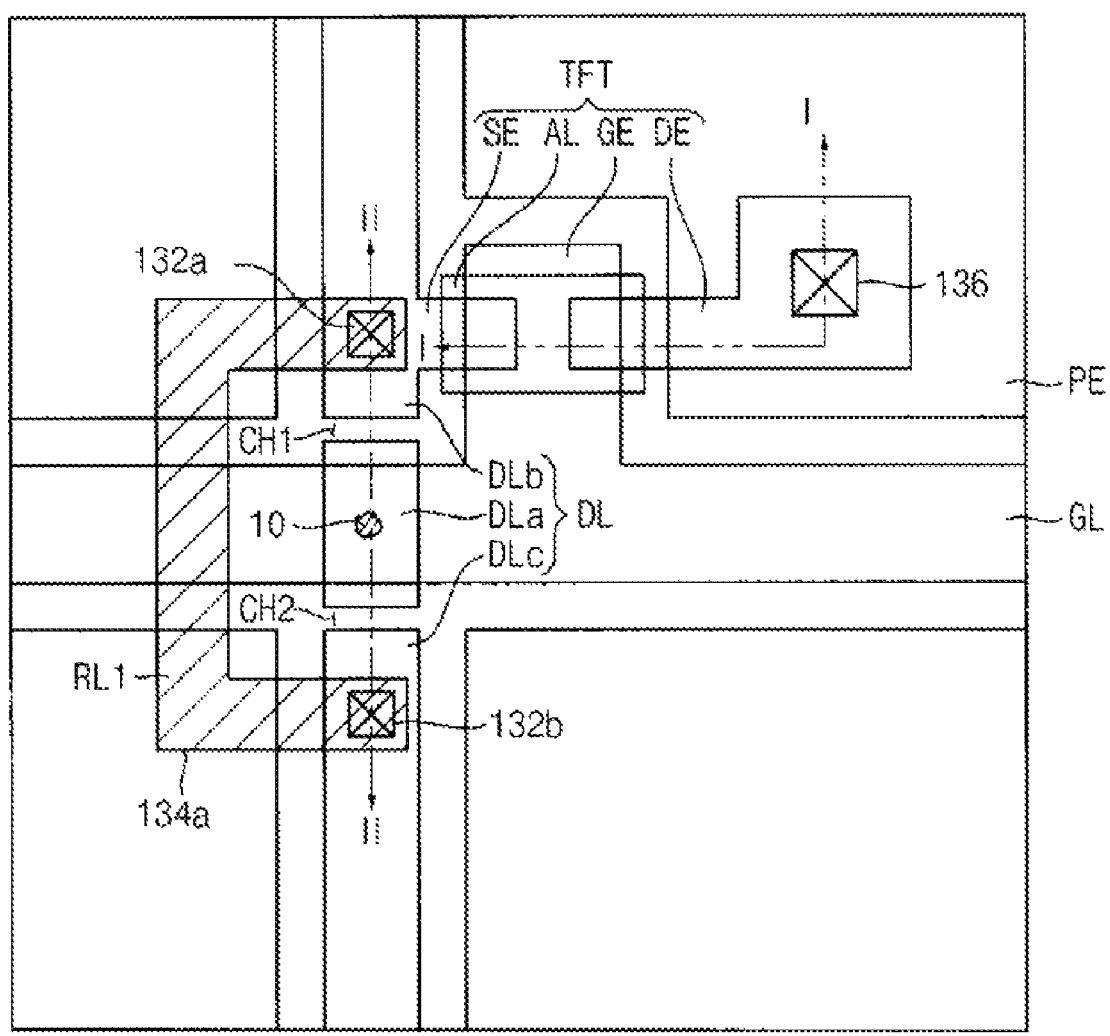
FIG. 2 is an enlarged plan view of the display substrate illustrated in FIG. 1.
Figure 2:
Figure 3:
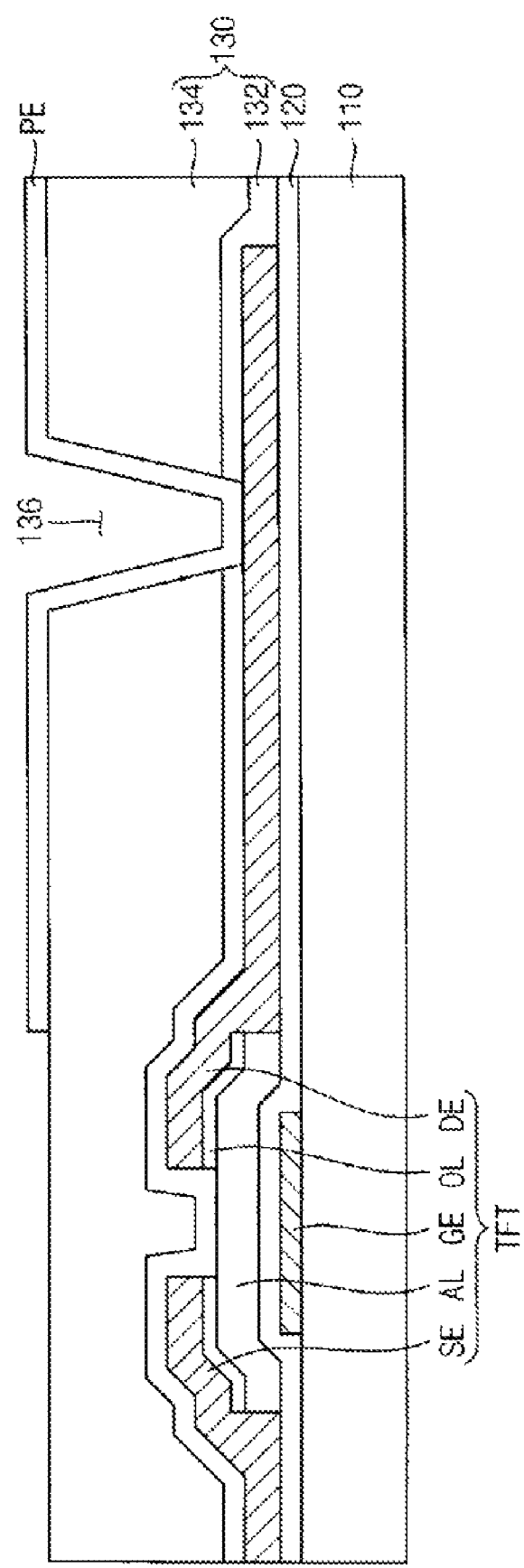
FIG. 3 is a cross-sectional view taken along a line I-I' in FIG. 2.

The repairing line RL1 is electrically connected to the gate line GL or the data line DL to repair the shorting failure. The repairing line RL1 may include, for example, a conductive material such as tungsten (W), molybdenum (Mo), nickel (Ni), chromium (Cr), and/or iron (Fe). FIG. 2 is an enlarged plan view of the display substrate illustrated in FIG. 1. FIG. 3 is a cross-sectional view taken along a line I-I' in FIG. 2.

Referring to FIGS. 1 to 3, the display substrate 100 includes a transparent substrate 110, the gate line GL a gate insulating layer 120, the data line DL, the thin-film transistor TFT a protecting layer 130 and the pixel electrode PE.

The transparent substrate 110 has a plate-shape and includes a transparent material: for example, glass, quartz, sapphire, and/or a transparent synthetic resin.

The gate line GL is formed on the transparent substrate 110. The gate insulating layer 120 is formed on the transparent substrate 110 to cover the gate line GL. The data line DL is formed on the gate insulating layer 120 and is electrically connected to the gate line GL.

The thin-film transistor TFT may include for example, a gate electrode GE, an active layer AL, a source electrode SE, a drain electrode DE and an ohmic contact layer OL.

The gate electrode GE is extended from the gate line GL in the second direction D2. The active layer AL is formed on the gate electrode GE. Particularly, the active layer AL is formed on the gate insulating layer 120 to cross the gate electrode GE. The active layer AL may include a semiconductor material, for example, amorphous silicon (a-Si).

The source electrode SE is extended from the data line DL in the first direction D1, and is overlapped with a portion of the active layer AL. The drain electrode DE is spaced apart from the source electrode SE by a predetermined distance and is extended in the first direction D1. The drain electrode DE is overlapped with a portion of the active layer AL.

The ohmic contact layer OL is formed between the active layer AL and the source electrode SE, and between the active layer AL and the drain electrode DE. For example, the ohmic contact layer OL may include highly ion-doped amorphous silicon (e.g., $n^+$ a-Si).

The protecting layer 130 is formed on the gate insulating layer 120 to cover the data line DL and the thin-film transistor TFT. The protecting layer 130 prevents the thin-film transistor TFT from being physically or chemically damaged.

The protecting layer 130 may include a first sub-protecting layer 132 and a second sub-protecting layer 134. The first sub-protecting layer 132 is formed on the gate insulating layer 120 to cover the data line DL and the thin-film transistor TFT. Examples of a material that may be used for the first sub-protecting layer 132 may include silicon nitride, and/or silicon oxide. The second sub-protecting layer 134 is formed on the first sub-protecting layer 132 to planarize a surface of the display substrate 100, and may include an organic material. Alternatively, the second sub-protecting layer 134 may include a color filter. The thickness of the first sub-protecting layer 132 may be about 0.05 to about 0.15 μm, and the thickness of the second sub-protecting layer 134 may be about 4 to about 5 μm.

A contact hole 136 is formed to expose a portion of the drain electrode DE. A portion of the protecting layer 130 is removed to form the contact hole 136.

The pixel electrode PE is formed on the second sub-protecting layer 134. The pixel electrode PE is electrically connected to the drain electrode DE through the contact hole 136. Examples of a material that may be used for the pixel electrode PE may include a transparent conductive material such as indium tin oxide (ITO), indium zinc oxide (IZO), and/or amorphous indium tin oxide (a-ITO).

Figure 4:
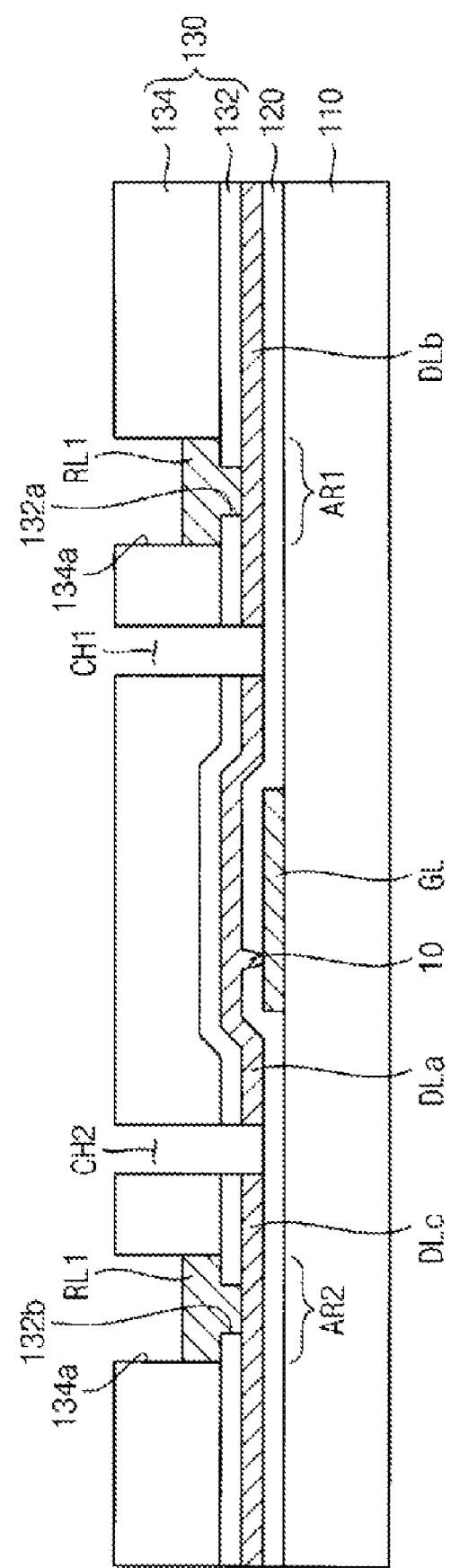
FIG. 4 is a cross-sectional view taken along a line II-II' in FIG. 2.

FIG. 4 is a cross-sectional view taken along a line II-II' in FIG. 2.

A shorting failure 10 is generated where the gate line GL and the data line DL intersect.

A repairing groove 134a is formed at the second sub-protecting layer 134. The repairing groove 134a has a predetermined shape that connects a first area AR1 to a second area AR2 spaced apart from the first area AR1 along a lengthwise direction of the data line DL. The shorting failure 10 is disposed between the first and second areas AR1 and AR2.

A first connecting hole 132a and a second connecting hole 132b are formed at the first sub-protecting layer 132. The first connecting hole 132a is formed in the first area AR1 to expose a portion of the data line DL. The second connecting hole 132b is formed in the second area AR2 to expose a portion of the data line DL.

A first disconnecting groove CH1 and a second disconnecting groove CH2 are formed at the protecting layer 130 and the data line DL to disconnect the data line DL. Particularly, the first disconnecting groove CH1 is formed between the shorting failure 10 and the first connecting hole 132a, and the second disconnecting groove CH2 is formed between the shorting failure 10 and the second connecting hole 132b.

The first and second disconnecting grooves CH1 and CH2 disconnect the data line DL to divide the data line DL into a cross data line DLa, a first non-cross data line DLb and a second non-cross data line DLc. For example, an insulating material may be disposed in each of the first and second disconnecting grooves CH1 and CH2.

The repairing groove 134a does not overlap the first and second disconnecting grooves CH1 and CH2. For example, the repairing groove 134a may have a 'U' shape as shown in FIG. 2.

The repairing line RL1 is formed in the repairing groove 134a and on the first sub-protecting layer 132. The repairing line RL1 is electrically connected to the first non-cross data line DLb through the first connecting hole 132a, and is electrically connected to the second non-cross data line DLc through the second connecting hole 132b. Thus, the repairing line RL1 electrically connects the first and second non-cross data lines DLb and DLc to repair the shorting failure 10.

The repairing line RL1 is formed in the repairing groove 134a that is spaced apart from the first and second disconnecting grooves CH1 and CH2, as shown in FIG. 2. As a result, the shorting failure 10 may be compensated, and the repairing line RL1 may be prevented from being damaged during a rinsing process of the display substrate 100.

The protecting layer 130 includes the first and second sub-protecting layers 132 and 134. In an alternative embodiment, the protecting layer 130 may have a single layer structure, wherein the repairing groove 134a does not pass through the protecting layer 130, and a lower portion of the protecting layer 130 is disposed on the repairing groove 134a and the data line DL. As a result, the repairing line RL1 may be formed on the lower portion of the protecting layer 130.

The repairing line RL1 is formed to repair the shorting failure 10 of the data line DL. Alternatively, the repairing line RL1 may be formed to repair a shorting failure of the gate line GL. For example, the repairing groove 134a may have a predetermined shape that connects a first area and a second area, which are spaced apart from each other by a predetermined length in a lengthwise direction of the gate line GL. The shorting failure 10 is disposed between the first and second areas. Connecting holes like the first and second connecting holes 132a and 132b may respectively expose a portion of the gate line GL. A repairing line like the repairing line RL1 may electrically connect disconnected portions of gate line GL to each other.

The embodiments of the present invention are described in connection with a liquid crystal display (LCD) apparatus. However, the present invention is not limited to an LCD apparatus and may be embodied in, for example, a plasma display panel (PDP), and an organic electroluminescence display.

Figure 5:
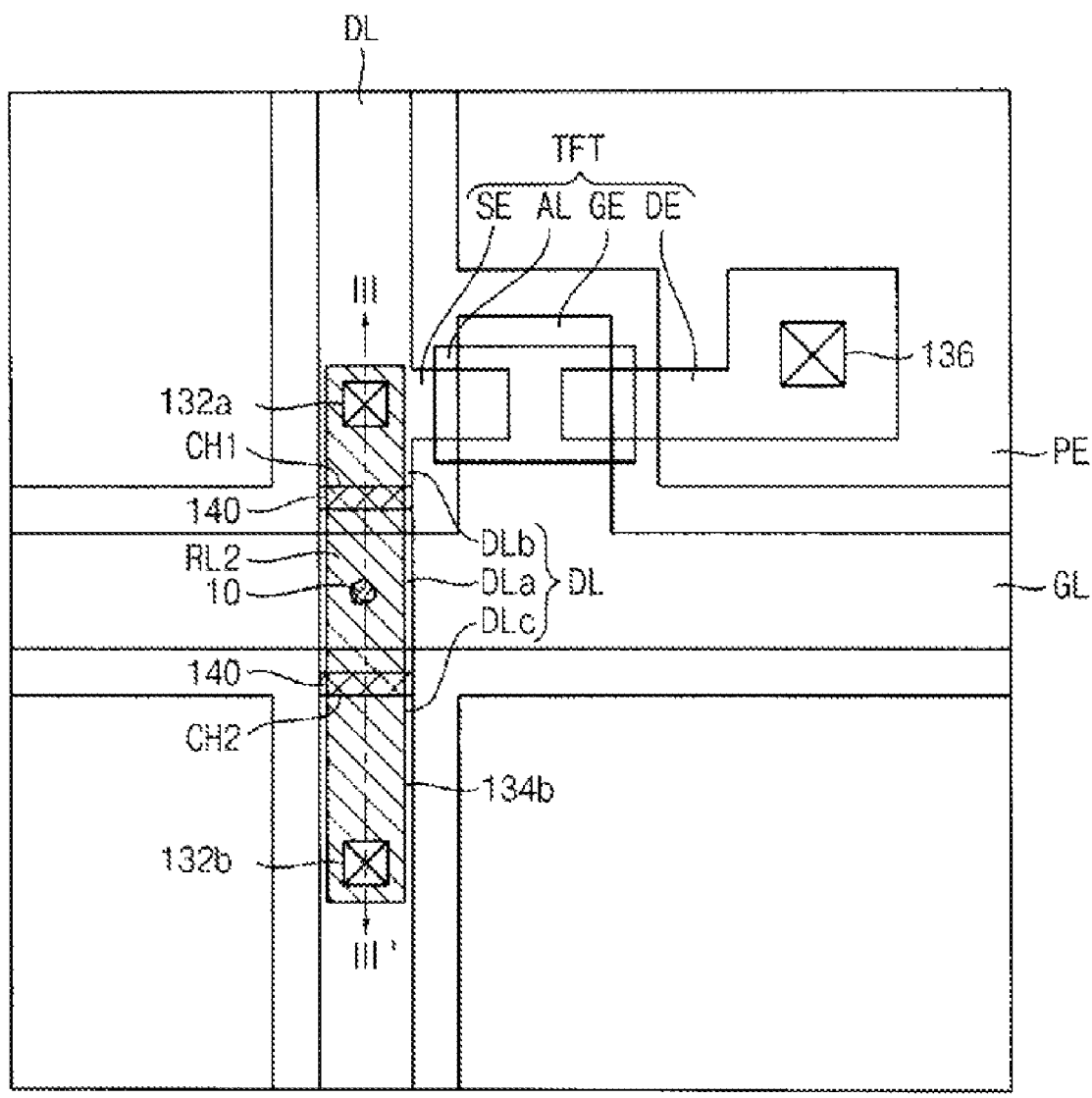
FIG. 5 is an enlarged plan view illustrating a display substrate according to an exemplary embodiment of the present invention.
Figure 6:
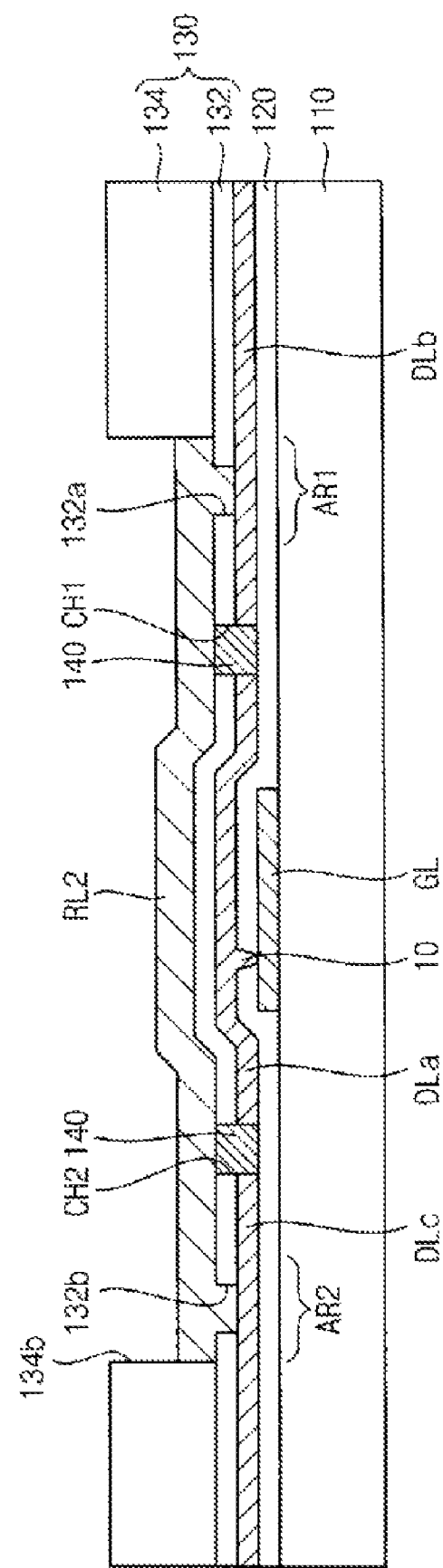
FIG. 6 is a cross-sectional view taken along a line III-III' in FIG. 5.

FIG. 5 is an enlarged plan view illustrating a display substrate according to an exemplary embodiment of the present invention, FIG. 6 is a cross-sectional view taken along a line III-III' in FIG. 5.

Referring to FIGS. 5 and 6, a display substrate 100 includes a transparent substrate 110, a gate line GL, a gate insulating layer 120, a data line DL, a thin-film transistor TFT a protecting layer 130, a pixel electrode PE, a repairing line RL2 and an insulating material 140.

The display substrate 100 is substantially the same as the display substrate illustrated in FIGS. 1 to 4 except with respect to, for example, the protecting layer 130, the insulating material 140 and the repairing line RL2. The shorting failure 10 is generated where the gate line GL and the data line DL intersect.

The protecting layer 130 is formed on the gate insulating layer 120 to cover the data line DL and the thin-film transistor TFT. The protecting layer 130 may include a first sub-protecting layer 132 and a second sub-protecting layer 134. A contact hole 136 is formed on a drain electrode DE of the thin-film transistor TFT to expose a portion of the drain electrode DE.

A repairing groove 134b is formed at the second sub-protecting layer 134. The repairing groove 134b has a predetermined shape connecting a first area AR1 and a second area AR2 that are spaced apart from each other in a lengthwise direction of the data line DL. The shorting failure 10 is disposed between the first and second areas AR1 and AR2. For example, the repairing groove 134b may have a linear shape, and a lengthwise direction of the repairing groove 134b may be substantially the same as that of the data line DL.

A first connecting hole 132a and a second connecting hole 132b are formed at the first sub-protecting layer 132, and the first and second connecting holes 132a and 132b are respectively disposed in the first and second areas AR1 and AR2.

A first disconnecting groove CH1 is formed between the shorting failure 10 and the first connecting hole 132a, and a second disconnecting groove CH2 is formed between the shorting failure 10 and the second connecting hole 132b.

The first and second disconnecting grooves CH1 and CH2 divide the data line DL into a cross data line DLa, a first non-cross data line DLb and a second non-cross data line DLc. For example, an insulating material 140 is disposed in each of the first and second disconnecting grooves CH1 and CH2.

The repairing line RL2 is formed in the repairing groove 134b and electrically connects the first and second non-cross data lines DLb and DLc to each other through the first and second connecting holes 132a and 132b. As a result, the repairing line RL2 can repair the shorting failure 10.

The repairing groove 134b overlaps the first and second disconnecting grooves CH1 and CH2. However, the insulating material 140 is disposed in the first and second disconnecting grooves CH1 and CH2. As a result, the repairing line RL2 can be prevented from being electrically connected to the data line DL through the first and second disconnecting grooves CH1 and CH2.

The repairing line RL2 electrically connects the disconnected data line DL. Alternatively, the repairing line RL2 may connect a disconnected gate line GL.

Figure 7:
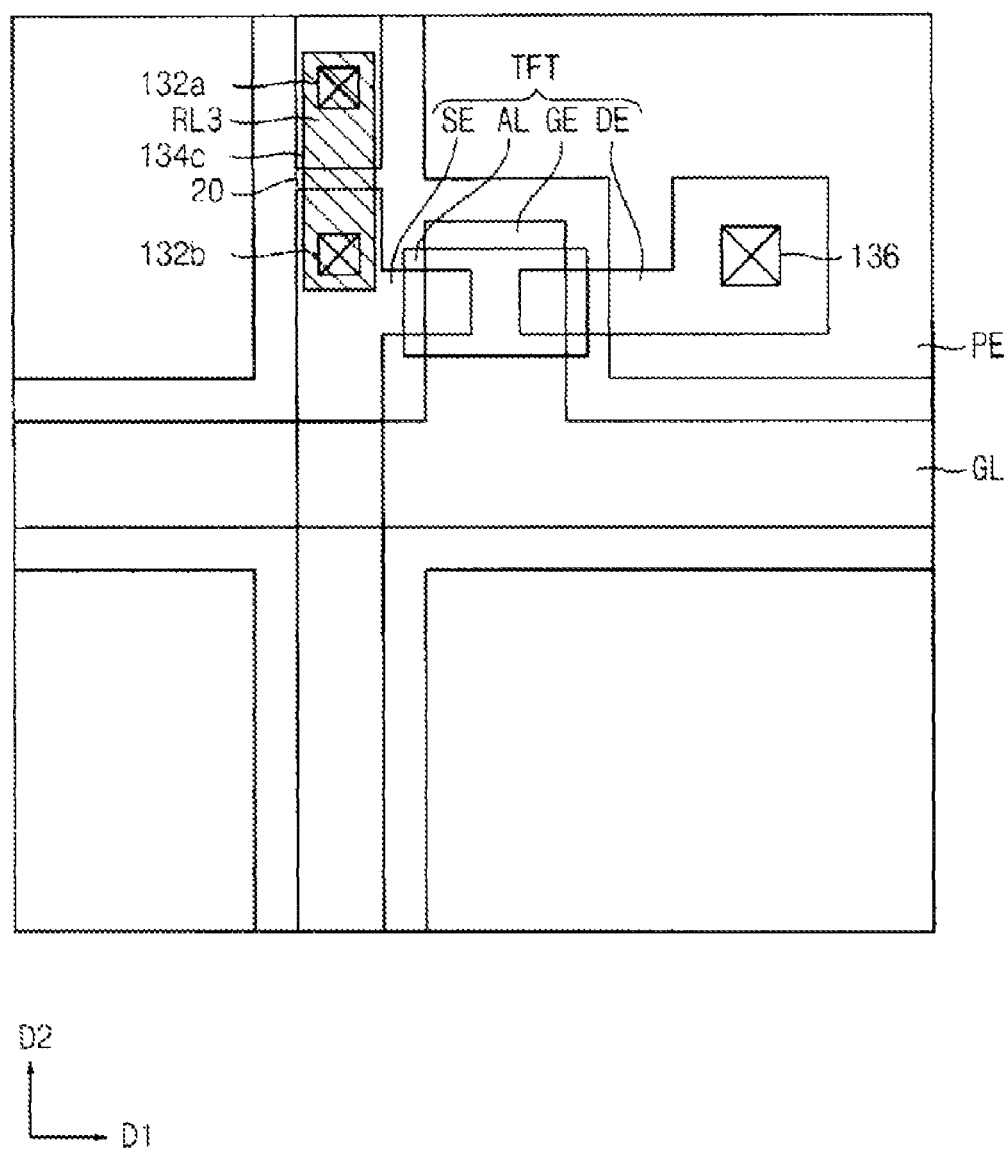
FIG. 7 is an enlarged plan view illustrating a display substrate according to an exemplary embodiment of the present invention.

FIG. 7 is an enlarged plan view illustrating a display substrate according to an exemplary embodiment of the present invention.

Referring to FIG. 7, a display substrate 100 includes a transparent substrate 110, a gate line GL, a gate insulating layer 120, a data line DL, a thin-film transistor TFT, a protecting layer 130, a pixel electrode PE and a repairing line RL3.

The display substrate 100 is substantially the same as the display substrate illustrated in FIGS. 1 to 4 except with respect to, for example, the protecting layer 130 and the repairing line RL3. A shorting failure 20 is generated in the data line DL.

The protecting layer 130 is formed on the gate insulating layer 120 to cover the data line DL and the thin-film transistor TFT. The protecting layer 130 may include a first sub-protecting layer 132 and a second sub-protecting layer 134. A contact hole 136 is formed on a drain electrode DE of the thin-film transistor TFT to expose a portion of the drain electrode DE.

A repairing groove 134c is formed at the second sub-protecting layer 134. The repairing groove 134c has a predetermined shape that connects a first area and a second area that are spaced apart from each other by a predetermined length in a lengthwise direction of the data line DL. The shorting failure 20 is disposed between the first and second areas. For example, the repairing groove 134c may have a linear shape, and a lengthwise direction of the repairing groove 134c may be substantially the same as the lengthwise direction of the data line DL.

A first connecting hole 132a and a second connecting hole 132b are formed at the first sub-protecting layer 132, and the first and second connecting holes 132a and 132b are respectively disposed in the first and second areas.

The repairing line RL3 is formed in the repairing groove 134c. The repairing line RL3 is electrically connected to the data line DL in the first area through the first connecting hole 132a and is electrically connected to the data line DL in the second area through the second connecting hole 132b. The repairing line RL3 electrically connects the data line DL in the first area and the data line DL in the second area. As a result, the repairing line RL3 can repair the shorting failure 20.

Figure 8:
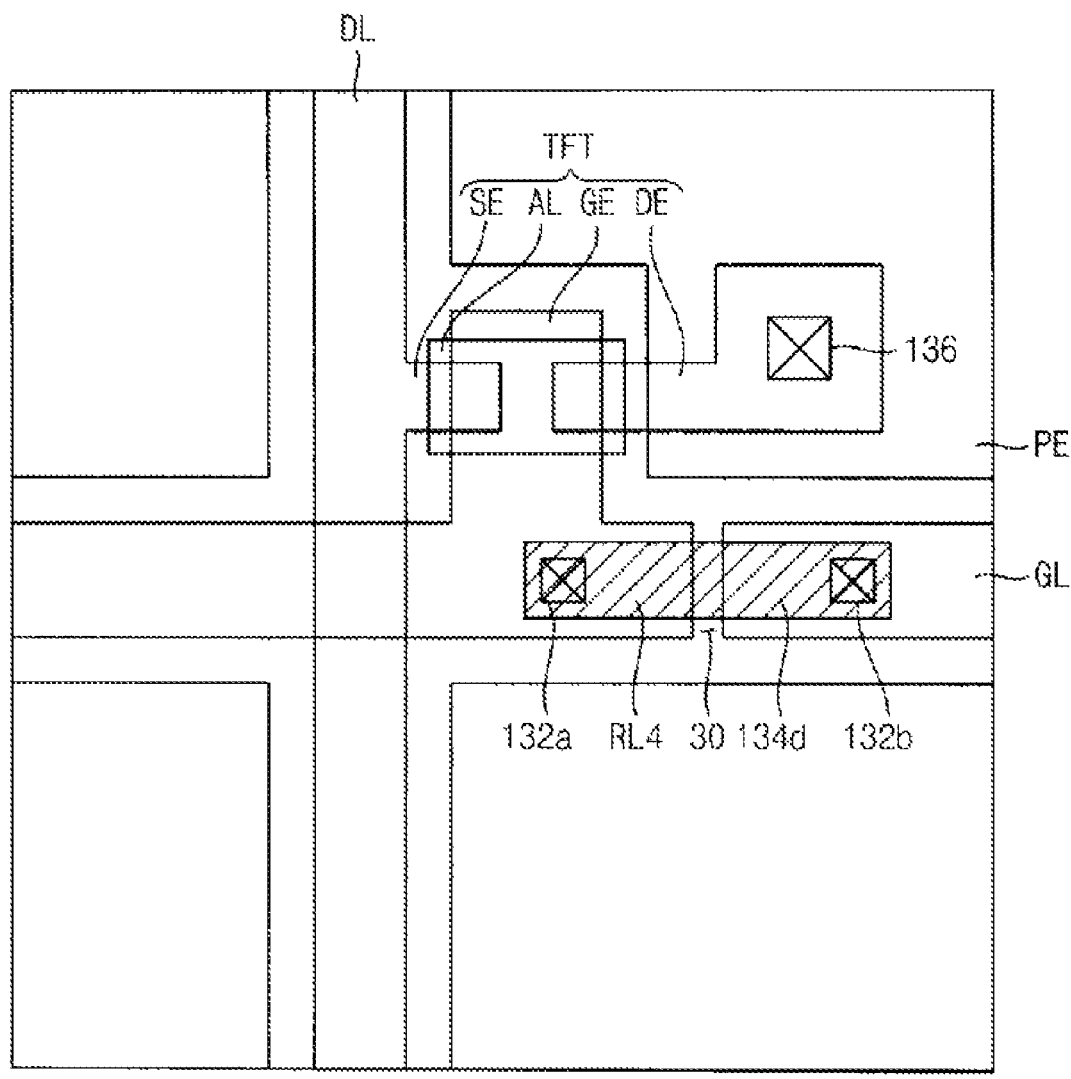
FIG. 8 is an enlarged plan view illustrating a display substrate according to an exemplary embodiment of the present invention.

FIG. 8 is an enlarged plan view illustrating a display substrate according to an exemplary embodiment of the present invention.

Referring to FIG. 8, a display substrate 100 includes a transparent substrate 110, a gate line GL, a gate insulating layer 120, a data line DL, a thin-film transistor TFT a protecting layer 130, a pixel electrode PE and a repairing line RL4.

The display substrate 100 is substantially the same as the display substrate illustrated in FIGS. 1 to 4 except with respect to, for example, the protecting layer 130 and the repairing line RL4. A shorting failure 30 is generated in the gate line GL.

The protecting layer 130 is formed on the gate insulating layer 120 to cover the data line DL and the thin-film transistor TFT. The protecting layer 130 may include a first sub-protecting layer 132 and a second sub-protecting layer 134. A contact hole 136 is formed on a drain electrode DE of the thin-film transistor TFT to expose a portion of the drain electrode DE.

A repairing groove 134d is formed at the second sub-protecting layer 134. The repairing groove 134d has a predetermined shape that connects a first area and a second area that are spaced apart from each other by a predetermined distance in a lengthwise direction of the gate line GL. The shorting failure 30 is disposed between the first and second areas. For example, the repairing groove 134c may have a linear shape, and a lengthwise direction of the repairing groove 134d may be substantially the same as that of the gate line GL.

A first connecting hole 132a and a second connecting hole 132b are formed at the first sub-protecting layer 132, and respectively disposed in the first and second areas.

The repairing line RL4 is formed in the repairing groove 134d. The repairing line RL4 is electrically connected to the gate line GL in the first area through the first connecting hole 132a and the gate line GL in the second area through the second connecting hole 132b. The repairing line RL4 electrically connects the gate line GL in the first area and the gate line GL in the second area. As a result, the repairing line RL4 may repair the shorting failure 30.

Figure 10:
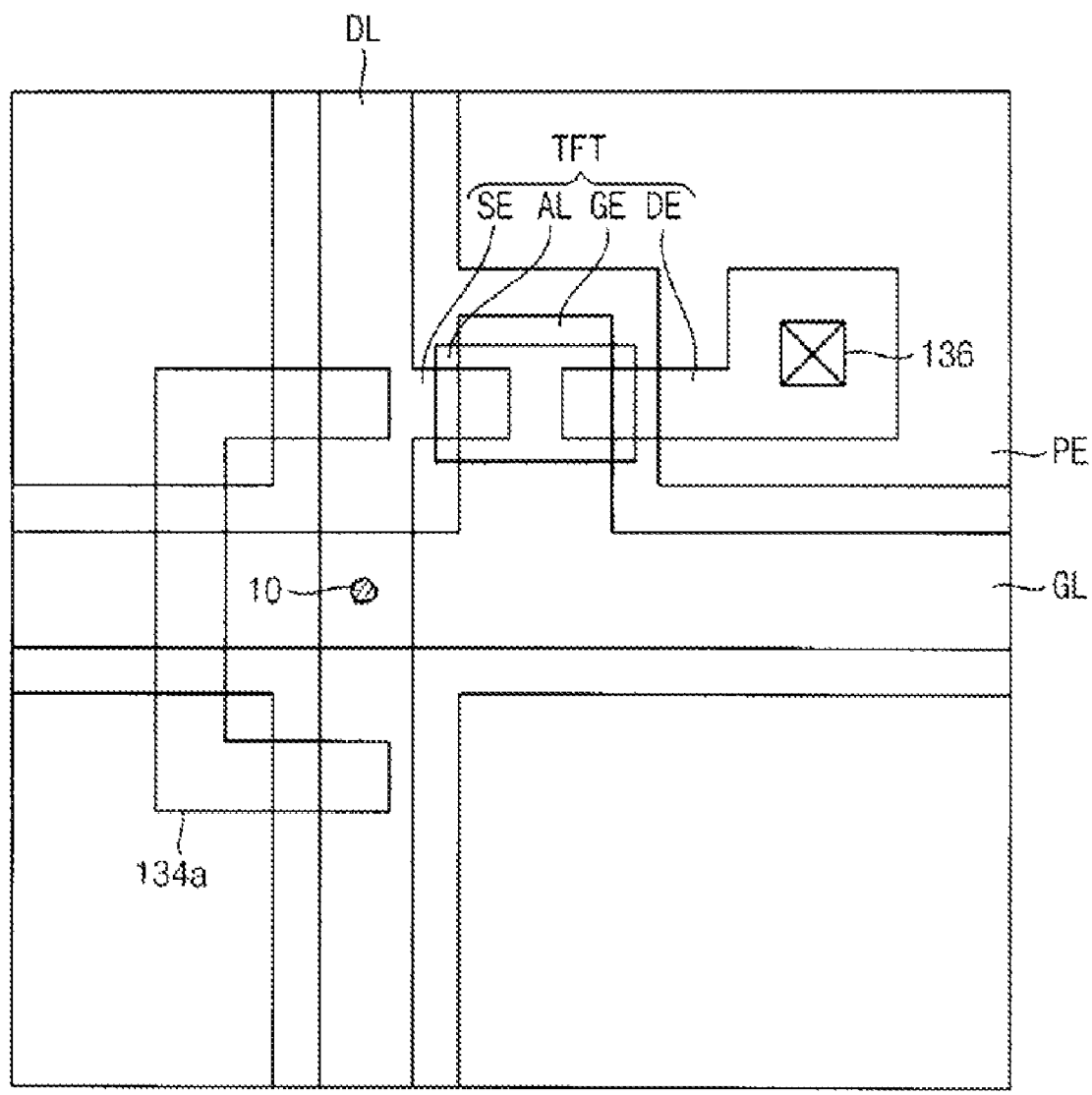
Figure 11:
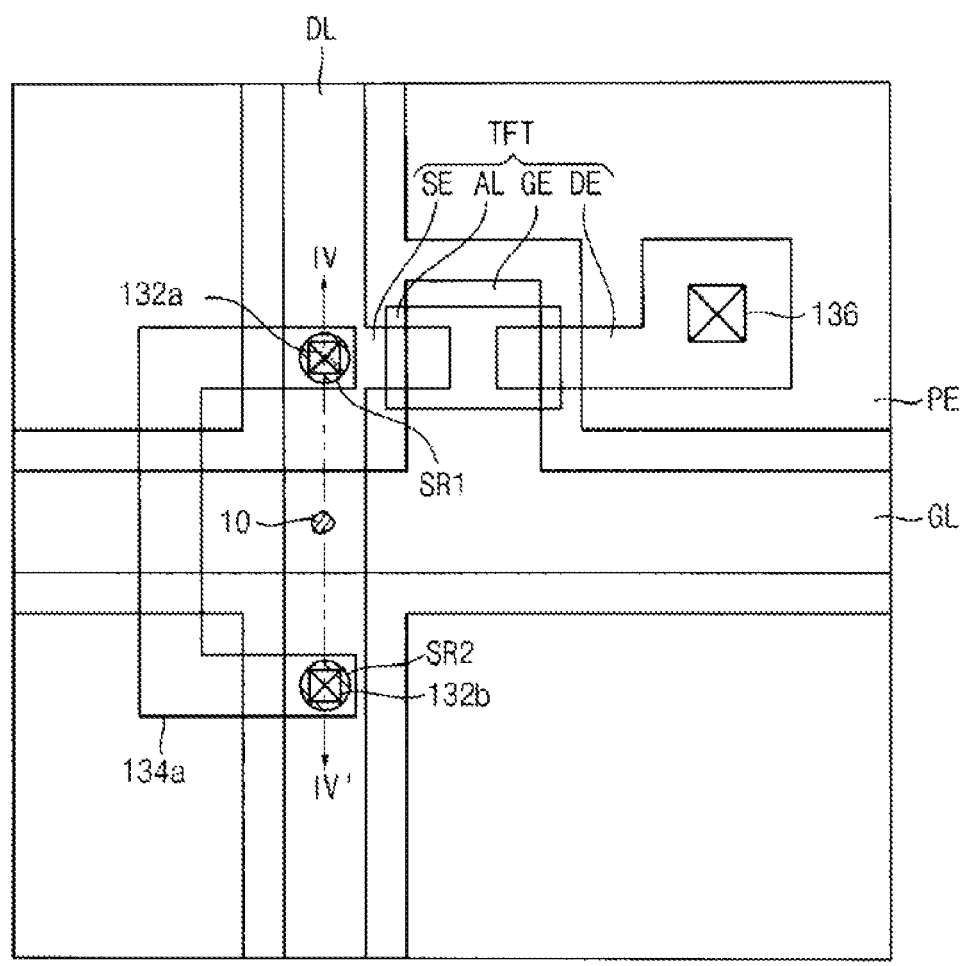
Figure 11:
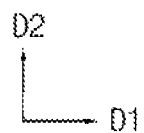
Figure 12:
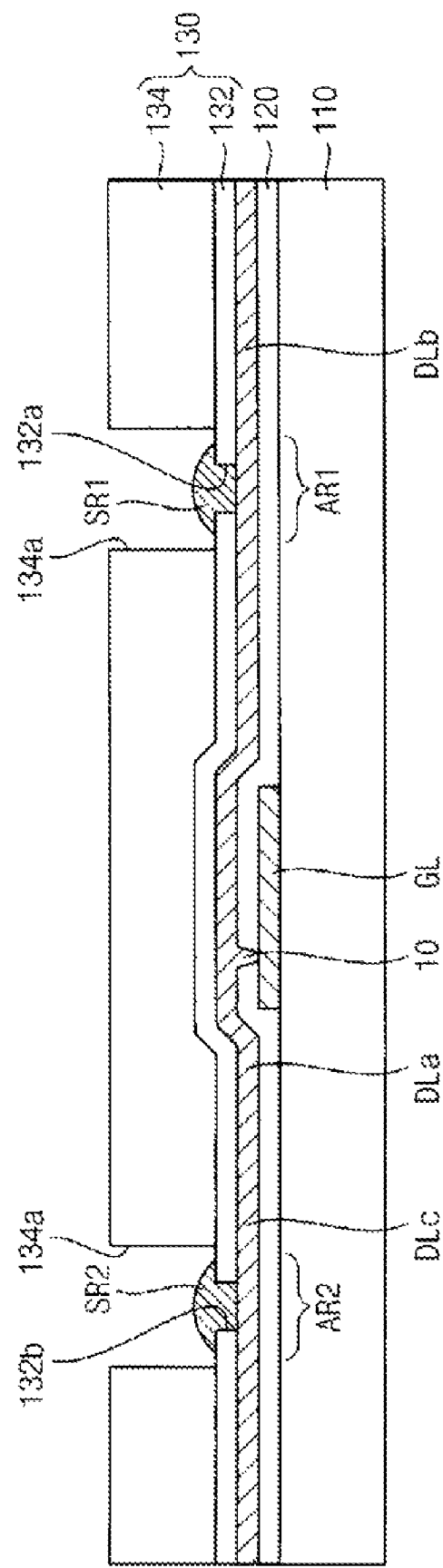

FIGS. 9, 10, 11 and 13 are plan views and FIG. 12 is a cross-sectional view for illustrating a method of repairing a display substrate according to an exemplary embodiment of the present invention.

Figure 9:
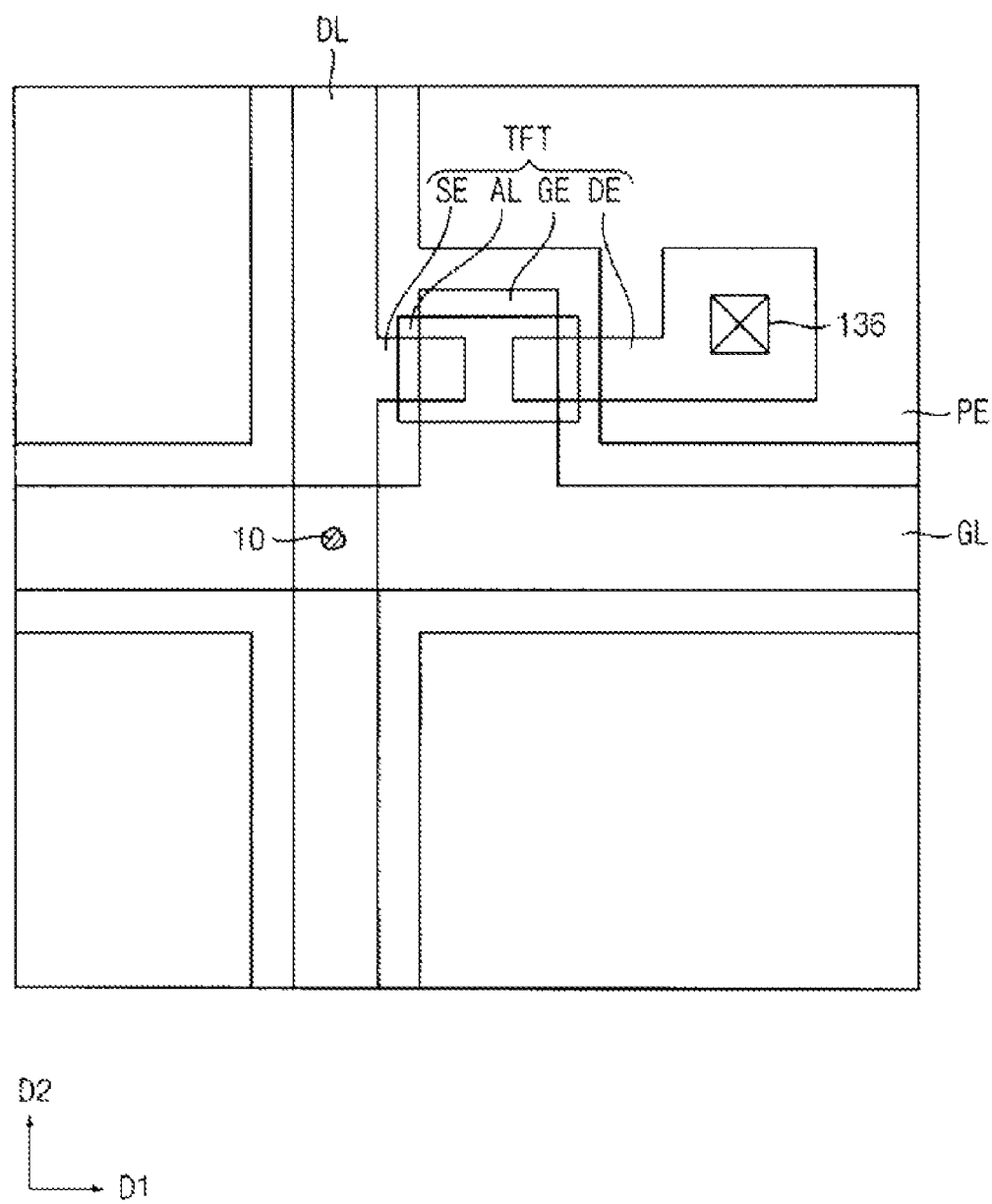
FIGS. 9 to 11 and 13 are plan views and FIG. 12 is a cross-sectional view for illustrating a method of repairing a display substrate according to an exemplary embodiment of the present invention.

FIG. 9 is a plan view illustrating a portion of a display substrate having an electrical connection failure.

Referring to FIGS. 1, 3 and 9, a display substrate 100 includes an electrical connection failure 10. For example, the display substrate 100 may be an array substrate used for an LCD apparatus. The display substrate 100 includes a transparent substrate 110, a gate line GL, a gate insulating layer 120, a data line DL, a thin-film transistor TFT a protecting layer 130 and a pixel electrode PE.

The transparent substrate 110 has a plate-shape. The gate line GL is formed on the transparent substrate 110. The gate insulating layer 120 is formed on the transparent substrate 110 to cover the gate line GL. The data line DL is formed on the gate insulating layer 120 and is electrically insulated from the gate line GL. The thin-film transistor TFT is electrically connected to the gate line GL and the data line DL, and includes a gate electrode GE, an active layer AL, a source electrode SE, a drain electrode DE and an ohmic contact layer OL.

The protecting layer 130 is formed on the gate insulating layer 120 to cover the data line DL and the thin-film transistor TFT. The protecting layer 130 may include a first sub-protecting layer 132 and a second sub-protecting layer 134. Examples of a material that may be used for the first sub-protecting layer 132 may include nitrated silicon, and/or silicon oxide. The second sub-protecting layer 134 may include an organic material. Alternatively, the second sub-protecting layer 134 may include a color fitter.

The pixel electrode PE is formed on the protecting layer 130 and electrically connected to the drain electrode DE through a contact hole 136 formed at the protecting layer 130.

The shorting failure 10 is generated where the gate line GL and the data line DL intersect.

FIG. 10 is a plan view illustrating a formation of a repairing groove.

Referring to FIG. 10, a repairing groove 134a is formed at the protecting layer 130. A laser beam is irradiated onto the protecting layer 130. As a result, a portion of the protecting layer 130 is removed to form the repairing groove 134a. Examples of the laser beam may include a continuous wave (CW) laser beam. The wavelength of the laser beam may be about 340 to about 360 nm.

Particularly, a portion of the second sub-protecting layer 134 may be removed so that a portion of the first sub-protecting layer 132 is exposed.

The repairing groove 134a has a predetermined shape that connects a first area and a second area that are spaced apart from each other by a predetermined length in a lengthwise direction of the data line DL. The shorting failure 10 is disposed between the first and second areas. For example, the repairing groove 134a may have a 'U' shape as shown in FIG. 10.

FIG. 11 is a plan view for illustrating the formation of a first connecting portion and a second connecting portion. FIG. 12 is a cross-sectional view taken along a line IV-IV' in FIG. 11.

Referring to FIGS. 11 and 12, the shorting failure 10 is disposed between a first area AR1 and a second area AR2 that is spaced apart from the first area AR1 in a lengthwise direction of the data line DL. A first connecting hole 132a and a second connecting hole 132b are respectively formed in the first and second areas AR1 and AR2. A laser beam is irradiated onto the first and second areas AR1 and AR2 to form the first and second connecting holes 132a and 132b. A portion of the data line DL is exposed through the first and second connecting holes 132a and 132b. The laser beam may be substantially the same as the laser beam used for forming the repairing groove 134a.

The laser beam is irradiated onto the first sub-protecting layer 132 in the first and second areas AR1 and AR2, which are exposed through the repairing groove 134a, to form the first and second connecting holes 132a and 132b.

When the protecting layer 130 has a single layer structure, the laser beam may be irradiated onto the protecting layer 130 to form the repairing groove 134a such that a lower portion of the protecting layer 130 is disposed between the data line DL and the repairing groove 134a. Thereafter, the laser beam may be irradiated onto the lower portion of the protecting layer 130 in the first and second areas AR1 and AR2, which are disposed under the repairing groove 134a, to form the first and second connecting holes 132a and 132b.

A first connecting portion SR1 and a second connecting portion SR2 are formed in the first and second connecting holes 132a and 132b. The first and second connecting portions SR1 and SR2 respectively contact an exposed portion of the data line DL. Examples of a material that may be used for the first and second connecting portions SR1 and SR2 include a conductive material such as tungsten (W), molybdenum (Mo), nickel (Ni), chromium (Cr), and/or iron (Fe).

The first and second connecting portions SR1 and SR2 may be formed through a laser chemical vapor deposition (CVD) method. The laser CVD method partially irradiates a laser beam onto an object to deposit a vaporized material where the laser beam is irradiated. The laser beam may be substantially the same as the laser beam used for forming the repairing groove 134a.

Figure 13:
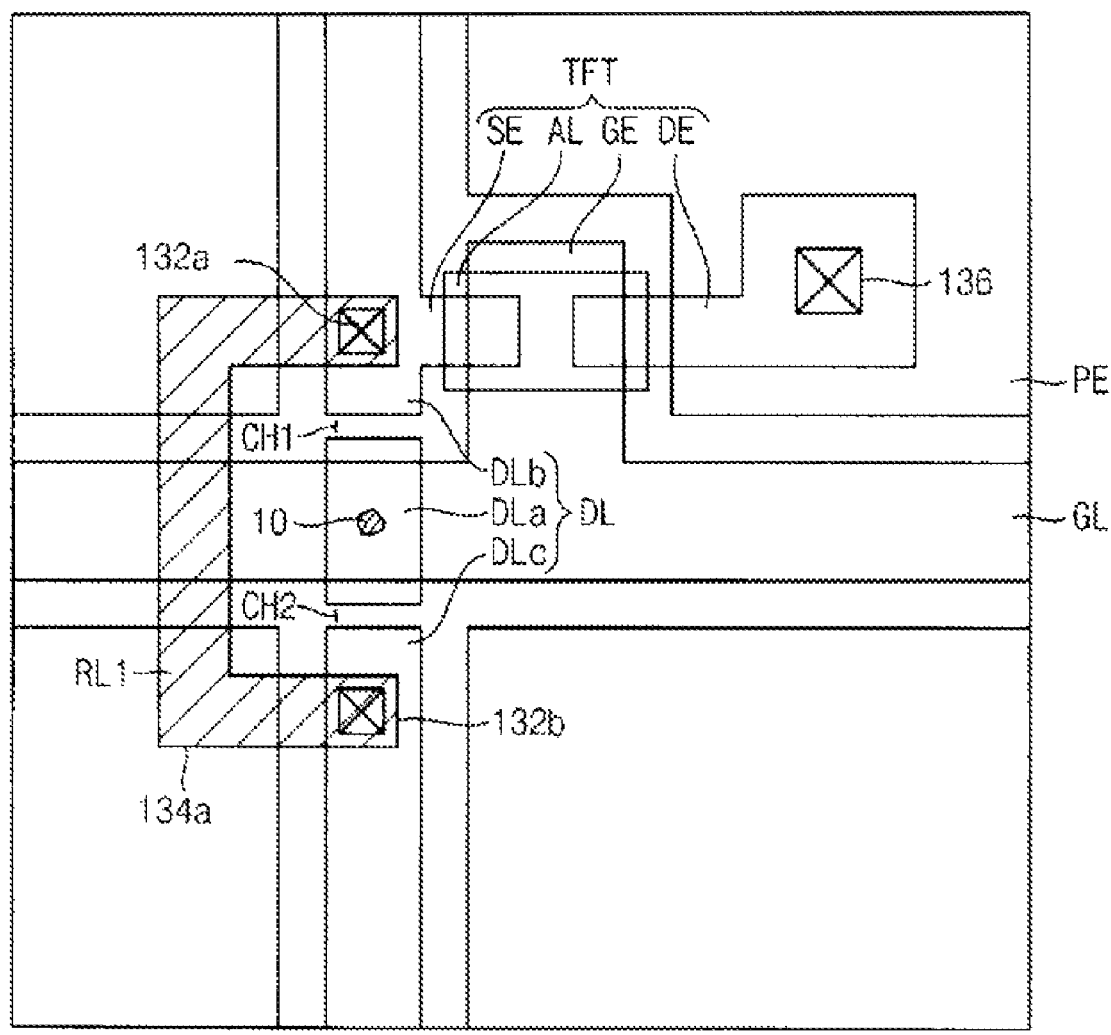

FIG. 13 is a plan view for illustrating a formation of a repairing line in the repairing groove and a formation of a first disconnecting groove and a second disconnecting groove to disconnect the data line.

Referring to FIG. 13, a repairing line RL1 is formed in the repairing groove 134a. The repairing line RL1 may be formed through the laser CVD method. A laser beam is irradiated onto the repairing groove 134a to deposit the repairing line RL1 in the repairing groove 134a. The laser beam may be substantially the same as the laser beam used for forming the repairing groove 134a. A material that may be used for the repairing line RL1 is substantially the same as the material that may be used for the first and second connecting portions SR1 and SR2.

A first disconnecting groove CH1 and a second disconnecting groove CH2 are formed to disconnect the data line DL, A laser beam is irradiated onto the data line DL along a first direction D1 substantially perpendicular to a lengthwise direction of the data line DL to form the first and second disconnecting grooves CH1 and CH2. The laser beam may be a pulse laser beam. For example, a wavelength of the pulse laser beam may be about 1063 nm, about 532 nm, or about 355 nm.

The first disconnecting groove CH1 is formed between the shorting failure 10 and the first connecting hole 132a, and the second disconnecting groove CH2 is formed between the shorting failure 10 and the second connecting hole 132b. The first and second disconnecting grooves CH1 and CH2 are not overlapped with the repairing groove 134a. The data line DL is divided into a cross data line DLa, a first non-cross data line DLb and a second non-cross data line DLc.

The repairing line RL1 is formed in the repairing groove 134a, and electrically connects the first and second non-cross data lines DLb and DLc that are electrically insulated from each other by the first and second disconnecting grooves CH1 and Ch2. As a result, the repairing line RL1 can repair the shorting failure 10.

After the first and second disconnecting grooves CH1 and CH2 are formed, the display substrate 100 may be rinsed by a rinsing process. Furthermore, an alignment film may be formed on the display substrate 100.

The repairing line RL1 is formed not on the protecting layer 130, but in the repairing groove 134a. Thus, the repairing line RL1 can be prevented from being damaged during the rinsing process of the display substrate 100.

The first and second disconnecting grooves CH1 and CH2 are formed after the repairing line RL1 is formed. Alternatively, the first and second disconnecting grooves CH1 and CH2 may be formed before the repairing line RL1 is formed.

The repairing line RL1 compensates for the shorting failure 10 of the data line DL. However, the repairing line RL1 may be positioned differently (e.g., to connect portions of the gate line GL) and used to repair a shorting failure of the gate line GL.

Figure 14:
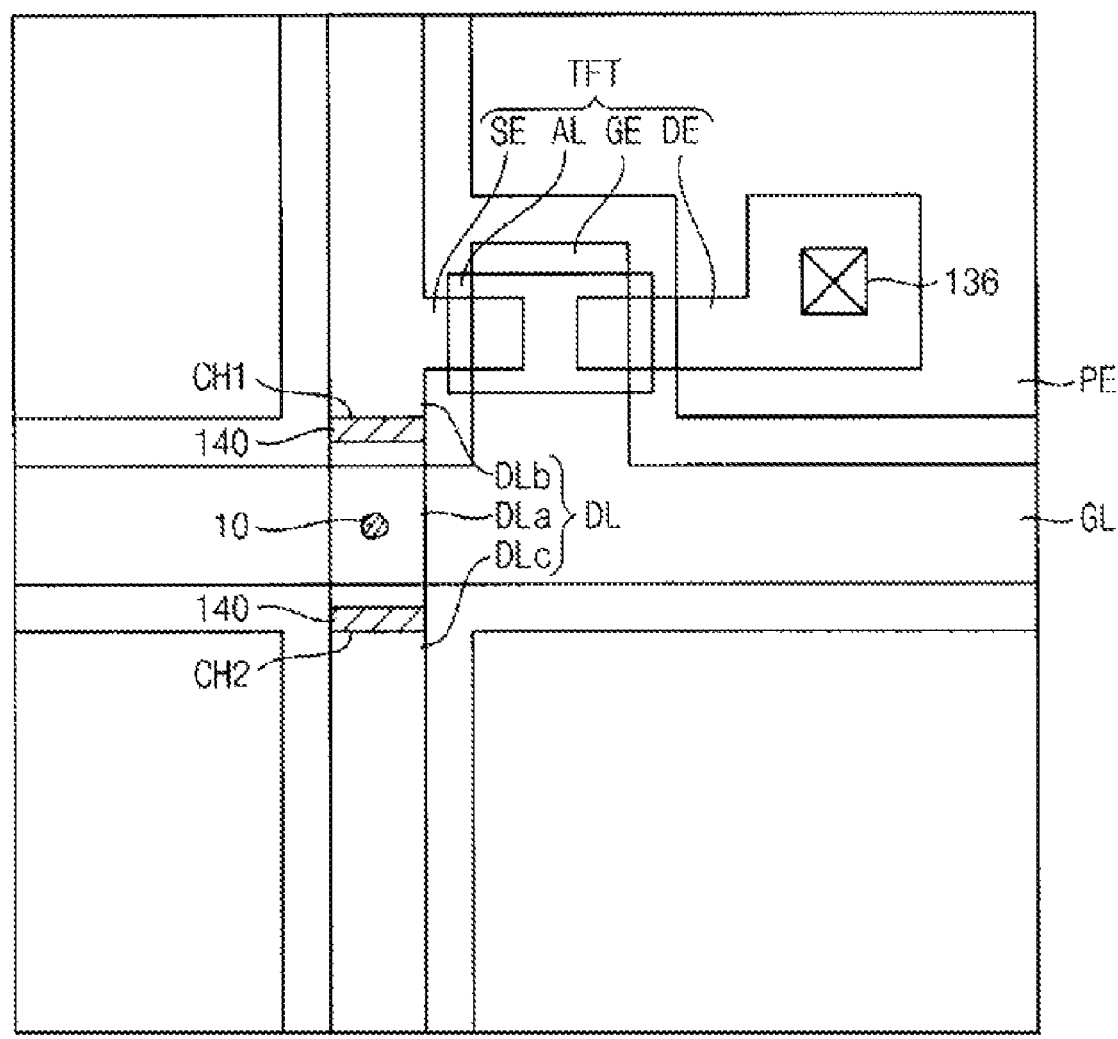
FIGS. 14 and 15 are plan views illustrating a method of repairing a display substrate according to an exemplary embodiment of the present invention.
Figure 14:
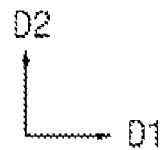
Figure 15:
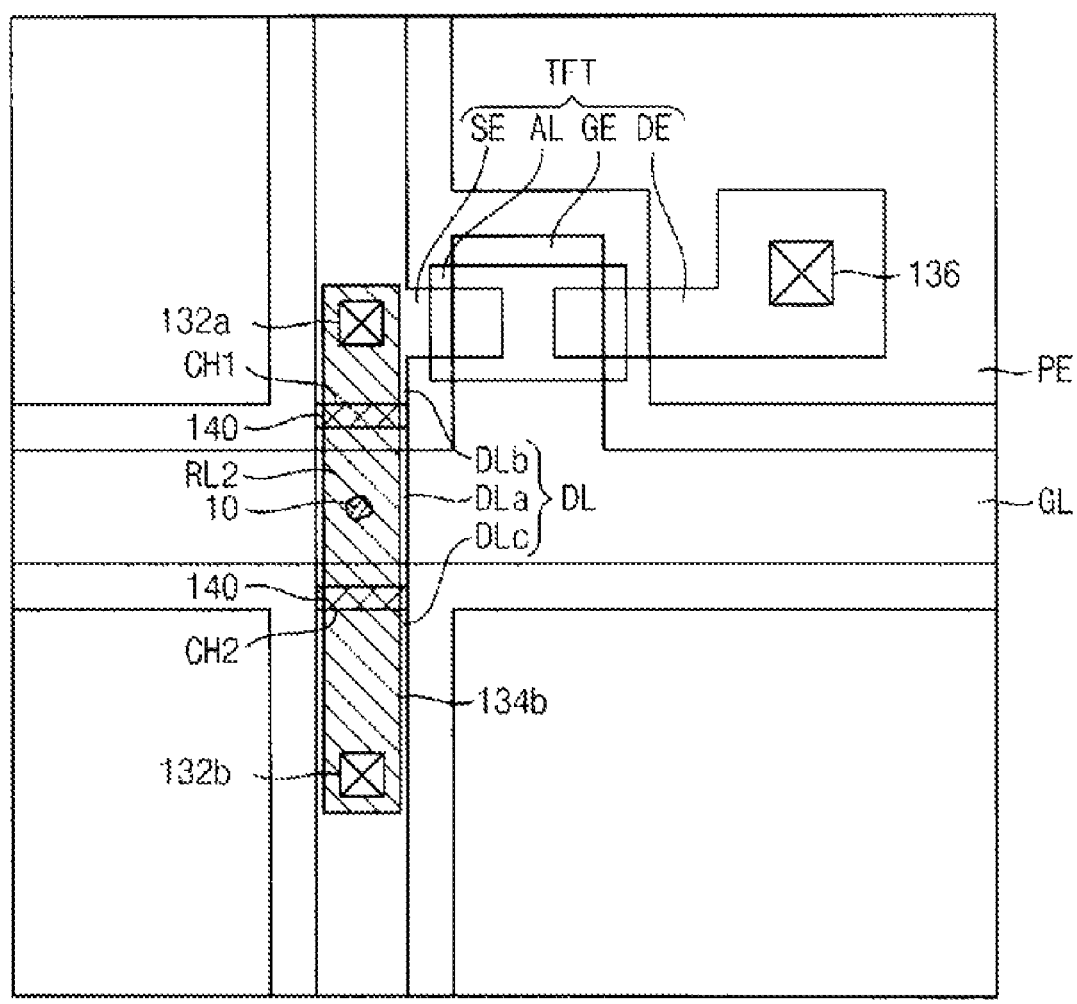
Figure 15:
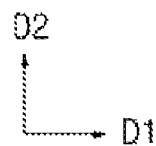

FIGS. 14 and 15 are plan views illustrating a method of repairing a display substrate according to an exemplary embodiment of the present invention. The display substrate is substantially the same as the display substrate illustrated in the FIGS. 5 and 6.

A display substrate 100 includes an electrical connection failure 10. For example, the display substrate 100 may be an array substrate used for an LCD apparatus. The display substrate 100 includes a transparent substrate 110, a gate line GL, a gate insulating layer 120, a data line DL, a thin-film transistor TFT a protecting layer 130 and a pixel electrode PE. The shorting failure 10 is generated where the gate line GL and the data line DL intersect.

FIG. 14 is a plan view for illustrating a formation of a first disconnecting groove and a second disconnecting groove and a disposition of an insulating material in the first and second disconnecting grooves.

Referring to FIG. 14, the first and second disconnecting grooves CH1 and CH2 are formed to disconnect the data line DL. A laser beam is irradiated onto the data line DL along a first direction D1 substantially perpendicular to a longitudinal direction of the data line DL to disconnect the data line DL. The laser beam may be pulse laser beam.

The first and second disconnecting grooves CH1 and CH2 are respectively formed in a first area and a second area that are spaced apart from each other in the lengthwise direction of the data line DL. The shorting failure 10 is disposed between the first and second areas. As a result, the data line DL is divided into a cross data line DLa, a first non-cross data line DLb and a second non-cross data line DLc.

An insulating material 140 is disposed in the first and second disconnecting grooves CH1 and CH2. The insulating material 140 may be deposited through a laser CVD method. Examples of the insulating material 140 may include silicon nitride, and/or silicon oxide.

FIG. 15 is a plan view for illustrating a formation of a repairing groove at the protecting layer and a formation of a repairing line.

Referring to FIG. 15, a repairing groove 134b is formed at the protecting layer 130 of the display substrate 100. A laser beam is irradiated onto the protecting layer 130 to remove a portion of the protecting layer 130 so that the repairing groove 134b is formed. Examples of the laser beam may include a continuous wave (CW) laser beam. A wavelength of the laser beam may be about 340 to about 360 nm.

The repairing groove 134b may have a predetermined shape that connects a first area and a second area that are spaced apart from each other by a predetermined distance in a lengthwise direction of the gate line DL. The shorting failure 10 is disposed between the first and second areas. For example, the repairing groove 134b may have a linear shape, and a lengthwise direction of the repairing groove 134b may be substantially the same as a lengthwise direction of the data line DL. The repairing groove 134b overlaps the first and second disconnecting grooves CH1 and CH2.

A first connecting hole 132a and a second connecting hole 132b are respectively formed in the first and second areas. A laser beam is irradiated onto the first and second areas to form the first and second connecting holes 132a and 132b. A portion of the data line DL is exposed through the first and second connecting holes 132a and 132b. The laser beam may be substantially the same as the laser beam used for forming the repairing groove 134b.

The first disconnecting hole CH1 is disposed between the first connecting hole 132a and the shorting failure 10. The second disconnecting hole CH2 is disposed between the second connecting hole 132b and the shorting failure 10.

A first connecting portion and a second connecting portion are respectively formed in the first and second correcting holes 132a and 132b to make contact with an exposed portion of the data line DL. A repairing line RL2 is formed in the repairing groove 134b. The first and second connecting portions and the repairing line RL2 may be formed through a laser CVD method. The first and second connecting portions, and the repairing line RL2 may include, for example, a conductive material such as tungsten (W), molybdenum (Mo), nickel (Ni), chromium (Cr), and/or iron (Fe).

The insulating material 140 is disposed in the first and second disconnecting grooves CH1 and CH2. As a result, the repairing line RL2 may be prevented from being electrically connected to the data line DL through the first and second disconnecting grooves CH1 and CH2.

The repairing line RL2 compensates for the shorting failure 10 of the data line DL. Alternatively, the repairing line RL2 may be positioned differently (e.g., along a length of the gate line GL) and used to repair a shorting failure of the gate line GL.

A method of repairing a display substrate according to an exemplary embodiment of the present invention is explained hereinafter with reference to FIG. 7. Referring to FIG. 7, a display substrate 100 includes an electrical connection failure 20. The display substrate 100 may be an array substrate used for an LCD apparatus. The display substrate 100 includes a transparent substrate 110, a gate line GL, a gate insulating layer 120, a data line DL, a thin-film transistor TFT, a protecting layer 130 and a pixel electrode PE. The data line DL has a shorting failure 20.

A repairing groove 134c is formed at the protecting layer 130. Particularly, a laser beam is irradiated onto the protecting layer 130 to remove a portion of the protecting layer 130 so that the repairing groove 134c is formed. The repairing groove 134c has a predetermined shape that connects a first area and a second area that are spaced apart from each other by a predetermined length in a lengthwise direction of the gate line DL. The shorting failure 20 is disposed between the first and second areas. For example, the repairing groove 134c has a linear shape, and a lengthwise direction of the repairing groove 134c is substantially the same as a lengthwise direction of the data line DL.

A first connecting hole 132a and a second connecting hole 132b are respectively formed in the first and second areas. A laser beam is irradiated onto the first and second areas to form the first and second connecting holes 132a and 132b. A portion of the data line DL is exposed through the first and second connecting holes 132a and 132b.

A first connecting portion and a second connecting portion are respectively formed in the first and second correcting holes 132a and 132b to make contact with an exposed portion of the data line DL. A repairing line RL3 is formed in the repairing groove 134c. The first and second connecting portions and the repairing line RL3 may be formed through a laser CVD method. Examples of a material that may be used for the first and second connecting portions, and the repairing line RL3 may include a conductive material such as tungsten (W), molybdenum (Mo), nickel (Ni), chromium (Cr), and/or iron (Fe).

The laser beam used for forming the repairing groove 134c and the first and second connecting holes 132a and 132b may be substantially the same as the laser beam used for forming the repairing line RL3. Examples of the laser beam may include a CW laser beam. The wavelength of the laser beam may be about 340 to about 360 nm.

When the repairing groove 134c and the first and second connecting holes 132a and 132b are formed using the laser beams a material for being deposited may be prevented from flowing into a chamber in a vapor state.

Referring to FIG. 8, a repairing line RL4 may be used to repair a shorting failure 30 of the gate line GL.

A repairing line is formed not on a protecting layer 130 but in a repairing groove formed by removing a portion of the protecting layer. Thus, the repairing line can be prevented from being damaged during a rinsing process of a display substrate and a display quality of the display substrate may be improved.

Although illustrative embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. Alt such changes and modifications are intended to be included within the scope of the invention as defined by the appended claims.

What is claimed is:
1. A display substrate comprising:
a signal line;
a protecting layer that covers the signal line, wherein the protecting layer includes a repairing groove formed therein; and
a repairing line formed in the repairing groove and electrically connected to the signal line to repair an electrical connection failure of the signal line,
wherein the protecting layer comprises a first sub-protecting layer and a second sub-protecting layer formed on the first sub protecting layer, and the repairing groove is formed through the second sub-protecting layer so that at least a portion of the repairing line is directly formed on an upper surface of the first sub-protecting layer,
wherein the repairing groove has a linear shape, and a lengthwise direction of the repairing groove is substantially the same as a lengthwise direction of the signal line.

2. The display substrate of claim 1, wherein the repairing groove connects a first area and a second area of the signal line that are spaced apart from each other by a predetermined distance in a lengthwise direction of the signal line, and the electrical connection failure is located between the first and second areas.

3. The display substrate of claim 1, wherein a first connecting hole and a second connecting hole are formed at the first sub-protecting layer to electrically connect the repairing line to the signal line.

4. The display substrate of claim 3, wherein the first sub-protecting layer is a passivation layer, and the second sub-protecting layer is an organic insulating layer or a color filter.

5. The display substrate of claim 3, wherein the electrical connection failure includes a shorting failure.

6. The display substrate of claim 3, wherein the signal line comprises one of a gate line or a data line, the electrical connection failure includes a shorting failure generated where the gate line and the data line intersect, and the signal line has a first disconnecting groove disposed between the first connecting hole and the electrical connection failure, and a second disconnecting groove disposed between the second connecting hole and the electrical connection failure to disconnect the signal line.

7. The display substrate of claim 6, wherein the first and second disconnecting grooves are formed after the repairing line is formed, and the first and second disconnecting grooves are spaced apart from the repairing groove.

8. The display substrate of claim 6, further comprising an insulating material disposed in each of the first and second disconnecting grooves.

9. The display substrate of claim 8, further comprising:
a thin-film transistor covered by the protecting layer and electrically connected to the signal line; and
a pixel electrode formed on the protecting layer and electrically connected to the thin-film transistor.

10. A method of repairing a display substrate, the method comprising:
removing a portion of a protecting layer covering a signal line to form a repairing groove; and
forming a repairing line in the repairing groove to repair an electrical connection failure, the repairing line being electrically connected to the signal line,
wherein the protecting layer comprises a first sub-protecting layer and a second sub-protecting layer formed on the first sub protecting layer, and the repairing groove is formed through the second sub-protecting layer so that at least a portion of the repairing line is directly formed on an upper surface of the first sub-protecting layer,
wherein the repairing groove has a linear shape, and a lengthwise direction of the repairing groove is substantially the same as a lengthwise direction of the signal line.

11. The method of claim 10, wherein the repairing groove connects a first area and a second area of the signal line that are spaced apart from each other by a predetermined distance in a lengthwise direction of the signal line, and the electrical connection failure is located between the first and second areas.

12. The method of claim 11, wherein forming the repairing line comprises:
removing a portion of the protecting layer corresponding to the first and second areas to form a first connecting hole and a second connecting hole through which a portion of the signal line is exposed; and
forming the repairing line in the repairing groove, the repairing line being electrically connected to the signal line through the first and second connecting holes.

13. The method of claim 12, wherein the first and second connecting holes are formed at the first sub-protecting layer.

14. The method of claim 13, wherein the first sub-protecting layer is a passivation layer, and the second sub-protecting layer is an organic insulating layer or a color filter.

15. The method of claim 11, wherein the repairing line is formed through a laser chemical vapor deposition (CVD) method.

16. The method of claim 15, wherein the repairing groove is formed using a laser beam substantially the same as a laser beam used for the laser CVD method.

17. The method of claim 16, wherein the laser beam is a continuous wave laser beam.

18. The method of claim 17, wherein a wavelength of the laser beam is about 340 nm to about 360 nm.

19. The method of claim 11, wherein the electrical connection failure includes a shorting failure.

20. The method of claim 11, further comprising forming a first disconnecting groove and a second disconnecting groove in the signal line to disconnect the signal line, wherein the signal line comprises one of a gate line or a data line, and the electrical connection failure includes a shorting failure generated where the gate line and the data line intersect and is disposed between the first and second disconnecting grooves.

21. The method of claim 20, wherein the first and second disconnecting grooves are formed using a pulse laser beam.

22. The method of claim 20, wherein the first and second disconnecting grooves are formed after the repairing line is formed, and the first and second disconnecting grooves are spaced apart from the repairing groove.

23. The method of claim 20, further comprising disposing an insulating material in the first and second disconnecting grooves, wherein the first and second disconnecting grooves are formed before the repairing line is formed.

24. A display substrate comprising:
a signal line;
a protecting layer that covers the signal line, wherein the protecting layer includes a repairing groove formed therein; and
a repairing line formed in the repairing groove and electrically connected to the signal line to repair an electrical connection failure of the signal line,
wherein the protecting layer comprises a first sub-protecting layer and a second sub-protecting layer formed on the first sub protecting layer, and the repairing groove is formed through the second sub-protecting layer so that at least a portion of the repairing line is directly formed on an upper surface of the first sub-protecting layer,
wherein the repairing groove has a substantial 'U' shape.

25. A method of repairing a display substrate, the method comprising:
removing a portion of a protecting layer covering a signal line to form a repairing groove; and
forming a repairing line in the repairing groove to repair an electrical connection failure, the repairing line being electrically connected to the signal line,
wherein the protecting layer comprises a first sub-protecting layer and a second sub-protecting layer formed on the first sub protecting layer, and the repairing groove is formed through the second sub-protecting layer so that at least a portion of the repairing line is directly formed on an upper surface of the first sub-protecting layer,
wherein the repairing groove has a substantial 'U' shape.

* * * * *